(12) United States Patent
Ganta et al.

(10) Patent No.: US 10,644,675 B2
(45) Date of Patent: May 5, 2020

(54) SWITCHED RESISTANCE DEVICE WITH REDUCED SENSITIVITY TO PARASITIC CAPACITANCE

(71) Applicant: Robert Bosch GmbH, Stuttgart (DE)

(72) Inventors: Saikrishna Ganta, Milpitas, CA (US); Man-Chia Chen, Palo Alto, CA (US); Chinwuba Ezekwe, Albany, CA (US)

(73) Assignee: Robert Bosch GmbH, Stuttgart (DE)

( * ) Notice: Subject to any disclaimer, the term of this patent is extended or adjusted under 35 U.S.C. 154(b) by 111 days.

(21) Appl. No.: 15/722,717

(22) Filed: Oct. 2, 2017

(65) Prior Publication Data
US 2019/0103856 A1 Apr. 4, 2019

(51) Int. Cl.
*H03B 1/00* (2006.01)
*H03H 11/04* (2006.01)
*H03H 19/00* (2006.01)

(52) U.S. Cl.
CPC .......... *H03H 11/04* (2013.01); *H03H 19/008* (2013.01)

(58) Field of Classification Search
None
See application file for complete search history.

(56) References Cited

U.S. PATENT DOCUMENTS

| | | | | |
|---|---|---|---|---|
| 6,420,927 B1 * | 7/2002 | Tavares | | H03H 19/004 327/554 |
| 6,614,294 B1 * | 9/2003 | Walden | | G11C 27/02 327/311 |
| 6,657,484 B1 * | 12/2003 | Bosshart | | H01L 23/5222 257/E23.144 |
| 6,982,584 B2 * | 1/2006 | Melly | | H03B 27/00 327/238 |
| 7,145,413 B2 * | 12/2006 | Hsu | | H03H 7/38 333/33 |
| 7,164,711 B2 * | 1/2007 | Yang | | H04L 25/03885 333/28 R |
| 7,239,196 B2 * | 7/2007 | Hasegawa | | H03H 11/1291 327/344 |
| 7,528,669 B2 * | 5/2009 | Milicevic | | H03K 3/0322 327/266 |
| 7,884,666 B1 * | 2/2011 | Welland | | H03L 7/18 327/156 |
| 8,248,123 B2 * | 8/2012 | Zeller | | H03L 7/093 327/147 |
| 8,344,822 B2 * | 1/2013 | Wang | | H03F 3/45475 333/101 |

(Continued)

*Primary Examiner* — Lincoln D Donovan
*Assistant Examiner* — Khareem E Almo
(74) *Attorney, Agent, or Firm* — Maginot, Moore & Beck LLP

(57) ABSTRACT

A stacked switched resistance device has been developed. The stacked switched resistance device includes a plurality of segments connected in series. Each segment includes a resistor including an inherent parasitic capacitance, and a switch connected in series with the resistor, the switch being configured to connect and disconnect the resistor from the plurality of segments in response to a predetermined clock signal. An effective resistance of the stacked switched resistance device exceeds another effective resistance of at least one resistor with an equivalent inherent resistance that is connected in series to a single switch configured to connect and disconnect the at least one resistor in response to the predetermined clock signal.

16 Claims, 4 Drawing Sheets

(56) References Cited

U.S. PATENT DOCUMENTS

| | | | | |
|---|---|---|---|---|
| 9,673,913 | B2* | 6/2017 | Brenner | H04B 15/005 |
| 9,847,788 | B2* | 12/2017 | Lye | H03M 1/1245 |
| 10,103,705 | B2* | 10/2018 | Charley | H01G 7/06 |
| 2010/0308882 | A1* | 12/2010 | Liu | H03K 5/131 |
| | | | | 327/283 |
| 2012/0313731 | A1* | 12/2012 | Burgener | H03H 9/542 |
| | | | | 333/188 |
| 2014/0022030 | A1* | 1/2014 | Wu | H03H 7/01 |
| | | | | 333/170 |
| 2014/0104132 | A1* | 4/2014 | Bakalski | H01L 29/42384 |
| | | | | 343/861 |
| 2014/0197900 | A1* | 7/2014 | Kalusalingam | H03L 7/16 |
| | | | | 333/32 |
| 2015/0326204 | A1* | 11/2015 | Cho | H03H 11/245 |
| | | | | 327/308 |
| 2016/0248400 | A1* | 8/2016 | Walker | H04W 72/0406 |
| 2017/0359052 | A1* | 12/2017 | Luong | H03J 3/185 |
| 2018/0013410 | A1* | 1/2018 | Yang | H03D 7/14 |
| 2018/0102764 | A1* | 4/2018 | Bacon | H03H 11/245 |
| 2018/0183409 | A1* | 6/2018 | Joish | H03G 1/0088 |
| 2018/0342941 | A1* | 11/2018 | Chang | H02M 1/08 |
| 2019/0020352 | A1* | 1/2019 | Gutta | H03M 3/322 |

\* cited by examiner

SWITCHED RESISTANCE DEVICE WITH REDUCED SENSITIVITY TO PARASITIC CAPACITANCE

FIELD

This disclosure relates generally to the field of electronic circuits and, more specifically, to switched resistors that provide electrical resistance in electronic circuits including, but not limited to, filters.

BACKGROUND

Many electronic circuits that are known to the art rely upon electrical resistors as building blocks of more complex circuits. Some circuits require resistors with comparatively large resistance values. In simple discrete circuits such as those commonly found on printed circuit boards (PCBs) discrete resistor components that are well-known to the art provide resistance values for a wide range of circuits. However, many modern circuit implementations rely on integrated circuits that use, for example, a silicon wafer as a substrate with various circuit components etched into the silicon wafer and connected together via metal interconnect layers using processes that are known to the art. In these circuits, the physical size of circuit elements including resistors directly affects the size of the circuit where those of skill in the art realize that one goal of modern circuit design is to produce smaller integrated circuits that can be manufactured more economically. One disadvantage of producing a resistor with a high resistance value in an integrated circuit is that a large resistor typically occupies a larger physical area of the circuit, which increases the overall size of the circuit.

One prior-art solution produces a resistor with a comparatively small physical size and a large resistance using a switched resistor configuration. FIG. 1 depicts an RC circuit 100 that incorporates a prior switched resistor 102 that further includes a resistor 104 (R) and a switch 108. The RC circuit also includes a voltage source 128 and a load capacitor 132. The circuit 100 of FIG. 1 depicts a simple RC filter but the switched resistor 102 can be incorporated in a wide range of other circuits that employ a resistor. The circuit 100 of FIG. 1 depicts an idealized configuration that omits the effects of the inherent parasitic capacitance Cp of the resistor R for explanatory purposes, although the effects of the parasitic capacitance are described below. The prior-art circuit schematic 140 is a distributed resistance model of the switched resistor 102 that includes a series connection of a single switch 108 and multiple resistors 104A-104N that each include a parasitic capacitance Cp 110A-110N. In the embodiment of FIG. 1, the resistors 104A-104N are each smaller than the resistor 104 and the sum of the resistances 104A-104N and the parasitic capacitances 110A-110N is equal to the resistance of the resistor 104 and the parasitic capacitance 110, respectively. The switched resistor model 140 produces the same effective resistance as the switched resistor 102 and is affected by parasitic capacitance in substantially the same manner as the switched resistor 102.

During operation, a clock source (not shown) operates the switch φ1 operates at a predetermined frequency and duty cycle to close the switch φ1 only during the period $T_{on}$ for each clock cycle $T_p$. When the switch 108 is opened the resistor 104 presents effectively infinite resistance and when the switch φ1 is closed during Ton the resistor R presents the inherent resistance R of the resistor to the voltage source.

The ideal effective resistance of the resistors 104 or 104A-104N that ignores the effects of parasitic capacitance becomes $$R_{\text{eff}} = \frac{R}{\left(\frac{T_{on}}{T_p}\right)}$$

where the ratio of $T_{on}$ and $T_p$ is also referred to as the duty cycle D $$\left(D = \left(\frac{T_{on}}{T_p}\right)\right) \text{ and } R_{\text{eff}} = \frac{R}{D}.$$

While the precise period of the clock cycle $T_p$ varies between embodiments, some prior-art switched resistors operate with a clock cycle in the kilohertz range (e.g. 25 KHz with a clock period time of $T_p = 4 \times 10^{-5}$ sec) and with duty cycles, on the order of $3.13 \times 10^{-2}$ that close the switch φ1 during the period ($T_{on}$) for a pulse time of $1.25 \times 10^{-6}$ sec (1.25 μsec) per clock cycle. Thus, the switched resistor circuit effectively produces a much larger average resistance value than the inherent resistance of the resistor R, which enables integrated circuit embodiments to use a resistor that occupies a comparatively small amount of space in the integrated circuit. In the embodiment of the simple RC filter in FIG. 1, the increased resistance of the switched resistance device enables the filter to operate with a lower corner frequency ($f_{3\ dB}$), which is described as the 3 decibel (dB) cutoff frequency of the filter:

$$f_{3dB} = \frac{1}{R_{\text{eff}} C_L} = \frac{D}{R C_L}.$$

The ideal resistance effective resistance $R_{\text{eff}}$ described above omits the effects of the parasitic capacitance $C_p$. The parasitic capacitance $C_p$ reduces the effective R in the switched resistance device of FIG. 1. In FIG. 1, the circuit 150 depicts a second, parallel resistance $R_p$ that models the effects of the parasitic capacitance $C_p$ when operating the switched resistor using a predetermined switching time period $T_p$. While switched resistance devices enable the use of a resistor with a smaller inherent resistance value to provide a larger effective resistance value, one problem that affects the prior art switched resistance device is that the parasitic capacitance that is inherent to the resistor tends to limit the maximum effective resistance that the switched resistance device produces in a practical circuit. In the ideal example that omits the parasitic capacitance the resistance $$R_{\text{eff}} = \frac{R}{D}$$

scales to large numbers simply by reducing the duty cycle D towards zero, but the parasitic capacitance $C_p$ in the actual implementation of the circuit reduces the practical maximum resistance level. The equivalent circuit 150 in FIG. 1 is another model of the resistor R that depicts the effects of the parasitic capacitance as a parallel resistance with a value of $$\frac{T_p}{C_p}.$$

Thus, the total resistance $R_{eff\_pa}$ for the prior-art switched resistor that incorporates the effects of the parasitic capacitance $C_p$ yields the lower effective resistance value:

$$R_{eff\_pa} = \frac{R}{D} \left|\left| \frac{T_p}{C_p} = \frac{R}{D + \frac{RC_p}{T_p}}\right.\right.$$

where the "||" notation indicates the two parallel resistances in the schematic diagram 150.

As set forth above, the effects of parasitic capacitance reduce the total effective resistance of the prior-art switched resistor 102. Additionally, the negative effects of the parasitic capacitance greatly increase in situations where the operating frequency of the switch increases and the corresponding time period Tp of each clock cycle in the switching signal decreases. For example, instead of the lower frequency of 25 KHz described above, many audio applications require that the switch operate a higher frequency of, for example, 50 KHz. For example, a prior art switched resistor with an inherent resistance of approximately $1.6 \times 10^6 \Omega$ (1.6 MΩ) and a parasitic capacitance of approximately $7.91 \times 10^{-13}$ F produces a total effective resistance of $$R_{eff\_pa\ (25\ KHz)} =$$
$$\frac{R}{D + \frac{RC_p}{T_p}} = \frac{1.6 \times 10^6\ \Omega}{3.13 \times 10^{-2} + \frac{(1.6 \times 10^6\ \Omega)(7.91 \times 10^{-13} F)}{4 \times 10^{-5}\ sec}} \approx 25.4 \times 10^6\ \Omega$$

when using the 25 KHz clock signal ($T_p = 4 \times 10^{-5}$ sec) and the duty cycle $D = 3.13 \times 10^{-2}$. However, raising the clock signal to 50 KHz ($T_p = 2 \times 10^{-5}$ sec) while holding all other parameters in the circuit equal produces a significantly lower effective resistance:

$$R_{eff\_pa\ (50\ KHz)} =$$
$$\frac{R}{D + \frac{RC_p}{T_p}} = \frac{1.6 \times 10^6\ \Omega}{3.13 \times 10^{-2} + \frac{(1.6 \times 10^6\ \Omega)(7.91 \times 10^{-13} F)}{4 \times 10^{-5}\ sec}} \approx 16.9 \times 10^6\ \Omega.$$

Thus, the increase in frequency produces a noticeable drop in the effective resistance of the prior art switched resistor since the time period $T_p$ drops while the parasitic capacitance remains constant.

As depicted above, the parasitic capacitance reduces the effective resistance of the prior-art switched resistance device. Consequently, improvements to resistance devices that produce large resistances while reducing the negative effects of parasitic capacitance would be beneficial.

SUMMARY

In one embodiment, a stacked switched resistance device has been developed. The stacked switched resistance device includes a plurality of segments connected in series and configured to produce a first effective resistance. Each segment includes a resistor including an inherent resistance an inherent parasitic capacitance, a switch connected in series with the resistor, the switch being configured to connect and disconnect the resistor from the plurality of segments in response to a predetermined clock signal. In the stacked switched resistance device, the first effective resistance of the stacked switched resistance device exceeds a second effective resistance of at least one resistor that is connected in series to a single switch configured to connect and disconnect the at least one resistor in response to the predetermined clock signal, the at least one resistor having an inherent resistance that is equal to a sum of the inherent resistances of the resistors in the plurality of segments and an inherent parasitic capacitance that is equal to a sum of the inherent parasitic capacitances of the resistors in the plurality of segments.

In another embodiment, a filter circuit that includes a stacked switched resistance device has been developed. The filter circuit includes a stacked switched resistance device including an input configured to receive a signal to be filtered in the filter circuit and an output. The stacked switched resistance device further includes a plurality of segments connected between the input and the output and configured to produce a first effective resistance. Each segment includes a resistor including an inherent resistance an inherent parasitic capacitance and a switch connected in series with the resistor, the switch being configured to connect and disconnect the resistor from the plurality of segments in response to a predetermined clock signal. In the stacked switched resistance device, the first effective resistance of the stacked switched resistance device exceeds a second effective resistance of at least one resistor that is connected in series to a single switch configured to connect and disconnect the at least one resistor in response to the predetermined clock signal, the at least one resistor having an inherent resistance that is equal to a sum of the inherent resistances of the resistors in the plurality of segments and an inherent parasitic capacitance that is equal to a sum of the inherent parasitic capacitances of the resistors in the plurality of segments. The filter circuit includes a filter capacitor connected to the output of the stacked switched resistance device.

The stacked switched resistance devices operate with improved immunity to the effects of parasitic capacitance that enables the stacked switched resistance device to provide larger effective resistance levels compared to prior art switched resistors and to reduce variations in the effective resistance levels due to variations in the parasitic capacitance levels within the resistors of the stacked switched resistance device. Additionally, the stacked switched resistance devices can operate with relaxed duty cycle timing constraints that enables a larger pulse width compared to the prior art switched resistors operated by the same clock cycle. The larger pulse width of the stacked switched resistance devices desensitizes the variation of duty cycle under a fix amount of pulse width error, and consequently, enables the stacked switched resistance devices to provide a more accurate predetermined level of resistance compared to prior art switched resistors.

DETAILED DESCRIPTION

For the purposes of promoting an understanding of the principles of the embodiments disclosed herein, reference is now be made to the drawings and descriptions in the following written specification. No limitation to the scope of the subject matter is intended by the references. The present disclosure also includes any alterations and modifications to the illustrated embodiments and includes further applications of the principles of the disclosed embodiments as would normally occur to one skilled in the art to which this disclosure pertains.

Figure 2:
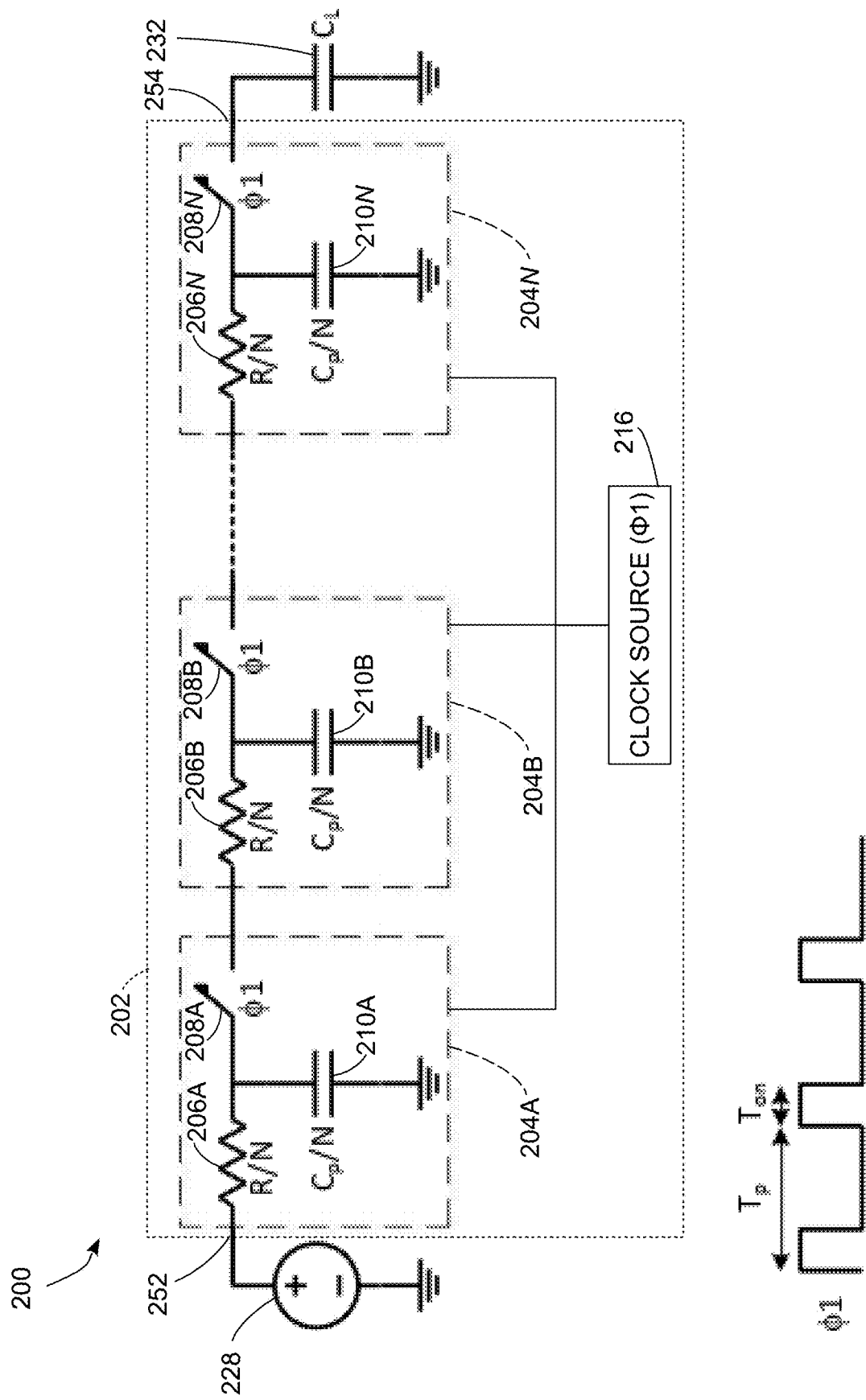
FIG. 2 is a schematic diagram of a stacked switched resistance device that is incorporated into a resistor-capacitor filter.

FIG. 2 is a schematic diagram of an RC filter circuit 200 that includes a stacked switched resistance device 202. The stacked switched resistance device 202 includes a plurality of resistor and switch segments 204A-204N. Each of the segments 204A, 204B, and 204N includes resistors 206A, 206B, and 206N, respectively, which are electrically connected in series with switches 208A, 208B, and 208N, respectively. FIG. 2 also depicts the parasitic capacitances 210A, 210B, and 210N in each of the segments 204A, 204B, and 204N, respectively. The parasitic capacitances 210A-210N do not represent distinct capacitor devices in the stacked switched resistance device 202, but instead represent the inherent parasitic capacitances in the structure of each of the corresponding resistors 206A-206N.

The stacked switched resistance device 202 also includes a clock source 216 that generates the clock signal φ1. The clock source 216 is, for example, a square wave generator or pulse generator that generates the clock signal φ1 with a predetermined clock period $T_p$ with a duty cycle in which the clock signal φ1 produces the signal pulse during time $T_{on}$ that corresponds to the time of the pulse in each cycle of the predetermined clock signal that closes each of the switches 208A-208N while the switches 208A-208N remain open during the remainder of each clock cycle period $T_p$. During the period $T_{on}$ during each cycle of the clock signal φ1 the switches 208A-208N close to enable electrical current to flow from the voltage source 228 through each of the segments 204A-204N in the stacked switched resistance device 202 and to the filter capacitor 232. In the embodiment of FIG. 2, the clock source 216 generates the clock signal φ1 that operates all of the switches 208A-208N simultaneously such that during operation of the stacked switched resistance device 202, all of the switches 208A-208N are opened and closed simultaneously at the predetermined frequency and duty cycle of the clock signal φ1. In the embodiment of FIG. 2, the clock source 216 is integrated into the stacked switched resistance device 202, while in other embodiments the stacked switched resistance device 202 receives clock signals from an external signal generator device.

In the embodiment of FIG. 2, the total inherent resistance of the resistors 206A-206N in the stacked switched resistance device 202 is the sum of the individual resistances of the resistors 206A-206N. In the embodiment of FIG. 2 each of the resistors 206A-206N has substantially the same resistance value and substantially the same parasitic capacitance value. Thus, in FIG. 2 each segment 204A-204N contributes a substantially equal fraction (1/N) of the total resistance and total parasitic capacitance for the N-segment stacked switched resistance device 202. However, alternative embodiments of the stacked switched resistance device 202 can include segments that incorporate resistors with different resistance values.

During operation of the circuit 200, the clock source 216 generates the clock signal φ1 to open and close the switches 208A-208N simultaneously in each of the segments 204A-204N, respectively. The switches 208A-208N remain closed only during the time $T_{on}$ during each cycle of the clock signal φ1 and the switches 208A-208N remain open during the remainder of the time period $T_p$ in each clock cycle of the clock signal φ1. In the stacked switched resistance device 202 each of the switches 208A-208N opens and closes at substantially the same time. As with the prior-art switched resistor circuit of FIG. 1, the stacked switched resistance device 202 generates a larger total resistance than the inherent resistance of the resistors 206A-206N. However, the structure and operation of the stacked switched resistance device 202 reduces the effects of the parasitic capacitances 210A-210N and enables the stacked switched resistance device 202 to produce a greater and accurate effective resistance compared to the prior art switched resistor even when both devices have the same total inherent resistance and parasitic capacitance values. For example given total inherent resistance level, such as 1.6 MΩ for a single resistor 104 of the circuit 100 or 160 KΩ in each segment for ten segments (N=10) in one embodiment of the stacked switched resistance device 202, and with the same total parasitic capacitance levels for both circuit configurations (e.g. $7.91 \times 10^{-13}$ F total parasitic capacitance), the stacked switched resistance device 202 enables both a higher total resistance level than the otherwise equivalent prior-art switched resistor 102 and the stacked switched resistance device 202 produces the higher resistance levels while allowing for a relaxed duty cycle for the clock source 216. Both of these beneficial attributes of the stacked switched resistance device 202 arise due to the structure of the stacked switched resistance device circuit that provide greater immunity to the effects of the parasitic capacitance on the effective resistance of the circuit.

While FIG. 2 depicts the stacked switched resistance device 202 with a total of three segments for illustrative purposes, different configurations of the stacked switched resistance device 202 include at least two segments and illustrative embodiments described herein include, for example, ten (10) segments and thirty (30) segments. The stacked switched resistance device is referred to as a "stacked" because the device 202 includes the plurality of resistor and switch segments 204A-204N that are connected in series to form a "stack" of segments that each receive the clock signal φ1 from the clock source 216. The circuit 200 is configured as a simple RC filter with a voltage source 228 that represents an input signal to an input of the stacked switched resistance device 202 in the RC filter 200 where the stacked switched resistance device 202 forms the resistance R and a filter capacitor 232 ($C_L$) forms the capacitance C. In one embodiment, at least some of the components of the RC filter circuit 200 including the stacked switched resistance device 202 and the filter capacitor 232 are formed as an integrated circuit in which the resistors 206A-206N are formed directly in a silicon wafer substrate using resistor structures that are otherwise known to the art, the switches 208A-208N are embodied as transistors or other suitable solid state switching elements, and the filter capacitor 232 is formed in the integrated circuit and connected to an output of the stacked switched resistance device 202. While FIG. 2 depicts an RC filter circuit 200 for illustrative purposes, the stacked switched resistance device 202 can be incorporated into other circuits that require a resistor as well.

During operation of the RC filter circuit 200 of FIG. 2, the voltage source 228 provides an input to an input terminal 252 of the first segment 204A in the stacked switched resistance device 202. The clock source 216 controls the operation of the switches 208A-208N at a predetermined frequency and duty cycle to enable the stacked switched resistance device 202 to provide a predetermined resistance to the input signal. The output terminal 254 of the stacked switched resistance device 202 is connected to the filter capacitor 232 and provides an output signal to the filter capacitor 232 after the signal has passed through each of the segments in the stacked switched resistance device 202. In the configuration of FIG. 2, the RC filter circuit 200 acts as a low-pass filter.

Parasitic Immunity Advantage of a Stacked Switched Resistance Device Vs. the Prior Art Based on the circuit diagram of FIG. 2, the expected resistance of each of the segments 204A-204N in the stacked switched resistance device 202 is expressed as:

$$R_{eff,seg} \cong \frac{R}{ND} \left|\left| \frac{T_p}{NC_p} = \frac{\frac{R}{N}}{D + \frac{RC_p}{T_p N^2}} \right.\right.$$

using segment 204A as an example, R/N is the inherent resistance of the resistor 206A, $C_p/N$ is the parasitic capacitance 210A, $T_p$ is the total time period of each cycle in the clock signal ϕ1, D is the duty cycle $$\left(\frac{T_{on}}{T_p}\right)$$

of the clock signal ϕ1, and N is the total number of segments. The total resistance for the entire stacked switched resistance device 202 corresponds to the sum of the resistances of all of the N segments, which is expressed as $$R_{eff,total} \cong N \times R_{eff,seg} = N \times \frac{\frac{R}{N}}{D + \frac{RC_p}{T_p N^2}}$$

in the embodiment of FIG. 2 where each of the segments has substantially the same total resistance and parasitic capacitance. As depicted above, the effective resistance of the entire stacked switched resistance device 202 is greater than the prior-art switched resistance device of FIG. 1 even if the total inherent resistance of both devices and the total parasitic capacitance of both devices are effectively the same. For example, given a total inherent resistance of 1.6 MΩ, total parasitic capacitance of $07.91 \times 10^{-13}$ F based on a parasitic capacitance scaling factor $\alpha = 0.5 \times 10^{-18}$ F/Ω, a clock cycle period $T_p$ of $2 \times 10^{-5}$ sec (corresponding to a frequency of 50 KHz), and a duty cycle of $3.13 \times 10^{-2}$, than the prior-art switched resistance device provides:

$$R_{eff\_pa\,(25\,KHz)} = \frac{R}{D + \frac{RC_p}{T_p}} = \frac{1.6 \times 10^6\,\Omega}{3.13 \times 10^{-2} + \frac{(1.6 \times 10^6\,\Omega)(7.91 \times 10^{-13} F)}{4 \times 10^{-5}\,\text{sec}}} \approx 16.9\,M\Omega$$

However, given the same parameters the stacked switched resistance device 202 that uses total of ten segments (N=10) with each segment including $\frac{1}{10}^{th}$ of the total resistance (1.6 MΩ/10=160 KΩ) and $\frac{1}{10}^{th}$ the total capacitance ($7.91 \times 10^{-13}$ F/10=$7.91 \times 10^{-14}$ F) provides the noticeably greater effective resistance:

$$R_{eff,total} = N \times \frac{R/N}{D + \frac{RC_p}{T_p N^2}} =$$

$$10 \times \frac{\frac{1.6 \times 10^6\,\Omega}{10}}{3.13 \times 10^{-2} + \frac{(1.6 \times 10^6\,\Omega)(7.91 \times 10^{-13} F)}{(2 \times 10^{-5}\,\text{sec})10^2}} \approx 50.1\,M\Omega.$$

As depicted in the equation above, the number of segments N effectively reduces the effect of the parasitic capacitance $C_p$ in a stacked switched resistance device. In particular, the structure of the stacked switched resistance device using two or more (N) segments reduces an effect of the sum of the inherent parasitic capacitances $C_p$ on the effective resistance of the stacked switched resistance device by a factor of $N^2$ for the number of the plurality of segments. This provides a factor of $N^2$ improvement for both the reduction of loss in effective resistance due to the parasitic capacitance as well as $N^2$ improvement in the relaxation of the pulse time constraint to produce a given effective resistance. The increased resistance of the stacked switched resistance device embodiment of FIG. 2 provides nearly the same resistance as the ideal resistance of a single switched resistor with the same inherent 1.6 MΩ resistance if the ideal resistor is (unrealistically) assumed to have zero parasitic capacitance:

$$R_{ideal} = \frac{R}{D} = \frac{1.6 \times 10^6 \Omega}{3.13 \times 10^{-2}} \approx 51.1\,M\Omega.$$

Figure 1:
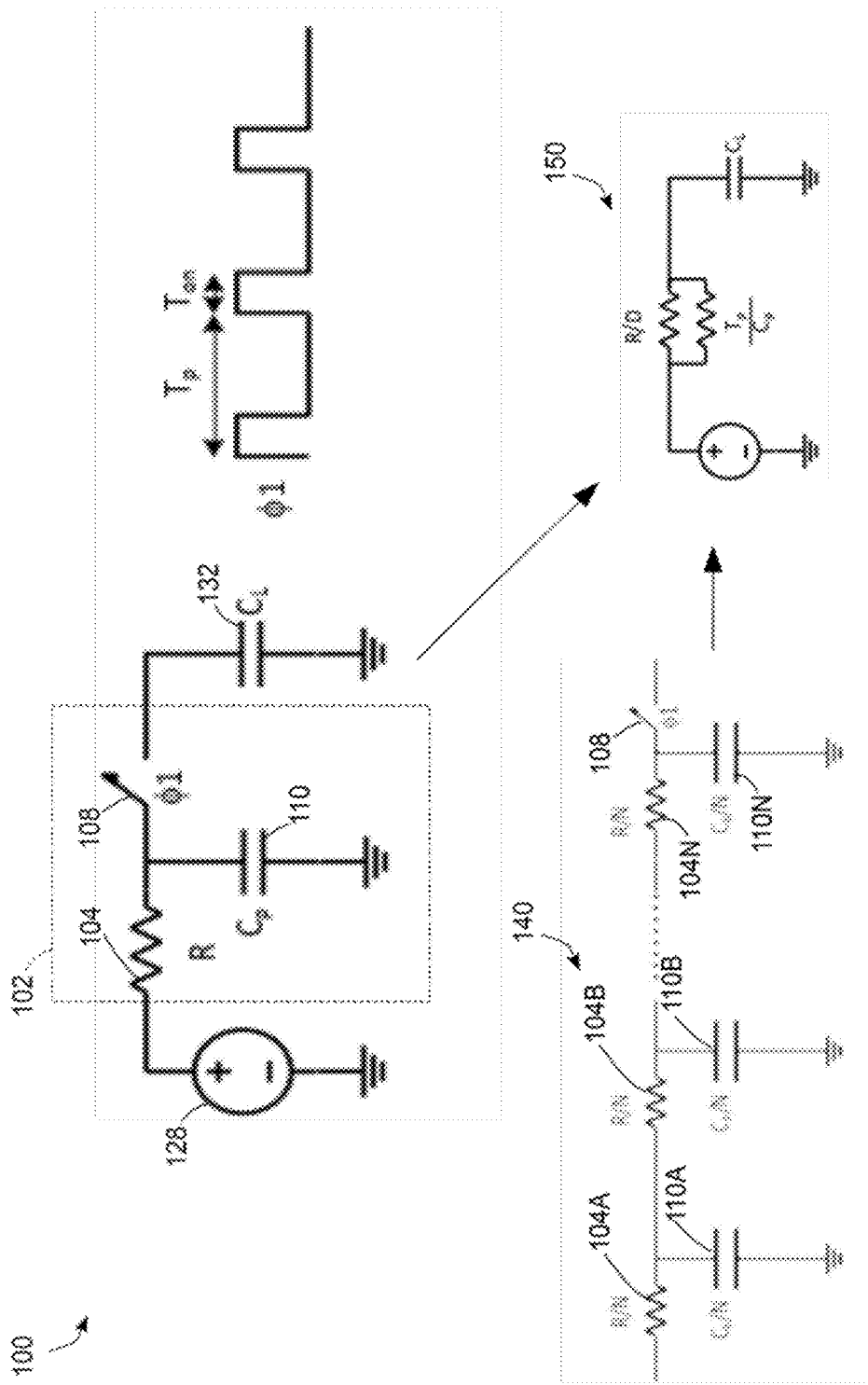
FIG. 1 is a schematic diagram of a prior-art switched resistor that is incorporated into a resistor-capacitor filter.

The greater resistance of the stacked switched resistance device 202 noticeably exceeds the arithmetic sum of the resistance that one of skill in the art would expect from a series connection of the same number N=10 smaller resistors in a prior-art device that uses a single switch, such as the prior art distributed resistance model 140 of FIG. 1 that is discussed above. The prior-art device switched resistance model 140 also delivers an effective resistance of approximately 16.9 MΩ in the same manner as the single-resistor prior-art switched resistor 102 while the stacked switched resistance device 202 of FIG. 2 delivers the greater 50.1 MΩ effective resistance while employing the same total inherent resistance and parasitic capacitance as the prior art devices. Thus, the actual stacked switched resistance device 202 delivers the much larger resistance level of 50.1 MΩ that noticeably exceeds the expected results from the prior-art switched resistors that include the same inherent resistance, inherent parasitic capacitance, and operate using the same clock signal as the stacked switched resistance device 202.

As described above, the stacked switched capacitance device 202 is able to operate at the higher 50 KHz clock signal frequency while still providing a substantially larger effective resistance compared to the prior art switched resistor. In addition to reducing the negative effects of parasitic capacitance on the total effective resistance, the stacked switched resistance device also exhibits improved immunity to variations in the level of parasitic capacitance while providing a highly accurate total effective resistance that cannot be achieved using the prior art switched resistor. For example, due to variances in manufacturing the precise parasitic capacitance of a resistor in a practical circuit may not be exactly the same as the nominal values that are presented above. In two examples the parasitic capacitance experiences a +/−20% variation range from the $7.91 \times 10^{-13}$ F nominal value presented above for a minimum parasitic capacitance $C_{p\text{-}min} = 6.33 \times 10^{-13}$ F and maximum parasitic capacitance $C_{p\text{-}max} = 9.49 \times 10^{-13}$ F.

In the ten-segment stacked switched resistance device embodiment with the nominal 50.1 MΩ effective resistance that is described above, these variations in the parasitic capacitance produce a small variation in total effective resistance from the nominal value of less than 1%:

$$R_{\textit{eff},Cp\text{-}min} = 10 \times \frac{\frac{1.6 \times 10^6 \Omega}{10}}{3.13 \times 10^{-2} + \frac{(1.6 \times 10^6 \Omega)(6.33 \times 10^{-13} F)}{(2 \times 10^{-5} \sec)10^2}} \approx$$

$$50.3 \; M\Omega \; \text{and} \; R_{\textit{eff},Cp\text{-}max} =$$

$$10 \times \frac{\frac{1.6 \times 10^6 \Omega}{10}}{3.13 \times 10^{-2} + \frac{(1.6 \times 10^6 \Omega)(9.49 \times 10^{-13} F)}{(2 \times 10^{-5} \sec)10^2}} \approx 49.9 \; M\Omega.$$

However, in addition to producing a much lower nominal effective resistance, the prior art switched resistor is also susceptible to much larger variations in total effective capacitance when subjected to the same variations in parasitic capacitance. For example, the prior art switched resistor 102 with the nominal resistance of 16.9 MΩ experiences substantially greater variations in effective resistance that exceed 10% due to the variations in parasitic capacitance:

$$R_{\textit{eff}\_pa\_Cp\text{-}min} = \frac{1.6 \times 10^6 \Omega}{3.13 \times 10^{-2} + \frac{(1.6 \times 10^6 \Omega)(6.33 \times 10^{-13} F)}{2 \times 10^{-5} \sec}} \approx$$

$$19.5 \; M\Omega \; \text{and} \; R_{\textit{eff}\_pa\_Cp\text{-}max} =$$

$$\frac{1.6 \times 10^6 \Omega}{3.13 \times 10^{-2} + \frac{(1.6 \times 10^6 \Omega)(9.49 \times 10^{-13} F)}{2 \times 10^{-5} \sec}} \approx 14.9 \; M\Omega.$$

Thus, the stacked switched resistance device 202 exhibits improved immunity to parasitic capacitance not only in producing a larger total effective resistance, but practical implementations of the stacked switched resistance device 202 is also provide a target nominal resistance level with a high level of accuracy even if the parasitic capacitance levels in the stacked switched resistance devices experiences large variations during manufacture.

Relaxed Timing Advantage of a Stacked Switched Resistance Device Vs. the Prior Art As described above, the stacked switched resistance device 202 operates using the clock source 216 that generates the clock signal φ1 to operate all of the switches 208A-208N simultaneously. The clock source 216 generates a pulse during a predetermined time period $T_{on}$ during each clock cycle period $T_p$ that closes the switches 208A-208N simultaneously. Once again, the duty cycle D of the clock signal is the fraction of the time period $T_p$ for each cycle of the clock signal during which the signal closes the switches 208A-208N:

$$D = \frac{T_{on}}{T_p}.$$

In a prior-art switched resistor, the operating frequency and corresponding cycle period $T_p$ of the clock signal is typically fixed due to system constraints and cannot be varied during operation of the switched resistor. The only available method to control the total effective resistance of the prior art switched resistor available to the prior art is to reduce the duty cycle D of the clock cycle, but the duty cycle D cannot be reduced indefinitely in a practical circuit because at small values many practical embodiments of a clock source cannot produce pulses that last for the duration of $T_{on}$ with sufficient accuracy to produce a desired target resistance accurately when considering the variations that often occur in the actual length of $T_{on}$ for very short pulses that may be on the order of a few nanoseconds or even less than one nanosecond. The short pulse width is typically controlled by delay lines in many practical embodiments and is prone to process, voltage and temperature (PVT) variations.

As noted above, the stacked switched resistance device 202 of FIG. 2 includes two or more segments where the resistor in each of the segments includes a substantially equal resistance level. The stacked switched resistance device embodiments described herein use segments that have equal resistance values in each segment for explanatory purposes, although this is not a strict requirement and the stacked switched resistance device 202 or other embodiments of stacked switched resistance devices can operate using segments that have different inherent resistance values. The following equation describes a maximization of the total resistance R in an embodiment that uses equal resistance values in each of N segments:

$$\frac{\partial R_{\textit{eff},total}}{\partial R} = \frac{1}{D + \frac{R^2 \alpha}{T_p N^2}} \left(1 - \frac{2R^2 \alpha}{N^2 T_p D + R^2 \alpha}\right) = 0, \text{ where } \alpha \triangleq \frac{C_p}{R}$$

is the parasitic coefficient of the resistor. A solution that generates a maximum total resistance level is:

$$R_{optimum} = N \sqrt{\frac{DT_p}{\alpha}}.$$

Using the $R_{optimum}$ value above, the total resistance for a given number of segments N, clock signal duty cycle D, clock signal time period $T_p$, and parasitic capacitance coefficient α is maximized as:

$$\max_R R_{\textit{eff,total}} = N\sqrt{\frac{T_p}{4D\alpha}}.$$

As noted above, the clock signal time period $T_p$ is dependent on the system constraints and the parasitic capacitance coefficient α is dependent upon manufacturing process. However, the stacked switched resistance device 202 enables circuit design that selects a number of segments with N≥2 to enable the design of a practical stacked switched resistance device using a duty cycle value D that is sufficiently large to enable a practical circuit design that provides an accurate target resistance level with minimal variation even if the precise pulse length from the clock source experiences variation.

As a practical example of the issues with very small duty cycles in prior-art switched resistors, one embodiment of a switched resistor uses an inherent resistance R=16.7 KΩ, parasitic capacitance $C_p$=8.34×10$^{-15}$ F, clock cycle period $T_p$=2×10$^{-5}$ sec and duty cycle D=3.5×10$^{-5}$ with $T_{on}$=7×10$^{-10}$ sec (0.7 nanoseconds) to produce a total effective resistance of approximately 400 MΩ:

$$R_{\textit{eff\_pa}} = \frac{16.7 \times 10^3 \Omega}{3.5 \times 10^{-5} + \frac{(16.7 \times 10^3 \Omega)(8.34 \times 10^{-15} F)}{2 \times 10^{-5} \text{sec}}} \approx 400 \ M\Omega.$$

However, even a small increase in the time period of $T_{on}$ from 0.7 nanoseconds to 1 nanosecond produces D'=5×10$^{-5}$ and a large deviation in the effective resistance:

$$R_{\textit{eff\_pa}} = \frac{16.7 \times 10^3 \Omega}{5 \times 10^{-5} + \frac{(16.7 \times 10^3 \Omega)(8.34 \times 10^{-15} F)}{2 \times 10^{-5} \text{sec}}} \approx 293 \ M\Omega.$$

This large variation in resistance from a very small variation in the duty cycle means that prior-art switched resistance devices with very short duty cycles are often impractical when using clock sources that may experience even relatively small variations (e.g. a 0.3 nanosecond pulse length variation) in the duration of the pulse $T_{on}$ that affects the duty cycle.

In contrast to the prior-art switched resistor, the stacked switched resistance device 202 enables a circuit design that uses a larger number of N segments to enable the stacked switched resistance device to produce a target resistance value using much larger duty cycles D that offer improved immunity to small variations in the clock signal. In a configuration that includes N=30 segments with a 500 KΩ resistance in each segment for a total resistance of R=15 MΩ, total parasitic capacitance $C_p$=7.56×10$^{-12}$ F, and the same clock signal with $T_p$=2×10$^{-5}$ sec, the stacked switched resistance device 202 produces the same 400 MΩ target resistance using a much larger duty cycle D=3.13×10$^2$, which corresponds to $T_{on}$=6.26×10$^{-7}$ sec (0.626 μsec).

$$R_{\textit{eff}} = 30 \times \frac{\frac{1.5 \times 10^6 \Omega}{30}}{3.13 \times 10^{-2} + \frac{(15 \times 10^6 \Omega)(7.56 \times 10^{-12} F)}{(2 \times 10^{-5} \text{sec})10^2}} \approx 400 \ M\Omega.$$

Given the much larger pulse length of 0.626 μsec, small variations in the operation of the clock source that produce minor changes in the duty cycle D have only minimal impact on the total effective resistance of the stacked switched resistance device 202. The prior-art switched resistor with same 15MΩ inherent resistance cannot produce the 400 MΩ effective resistance using the relaxed duty cycle due to the effects of the parasitic capacitance:

$$R_{\textit{eff\_pa}} = \frac{15 \times 10^6 \Omega}{3.13 \times 10^{-2} + \frac{(115 \times 10^6 \Omega)(7.56 \times 10^{-12} F)}{2 \times 10^{-5} \text{sec}}} \approx 2.6 \ M\Omega.$$

In fact, with the relaxed duty cycle the effects of the parasitic capacitance overwhelm the prior-art switched resistor and the total effective resistance is actually lower than the nominal 15 MΩ resistance level. Thus, the stacked switched resistance device 202 is operable using relaxed timing requirements for the clock signal that cannot be achieved using a prior-art switched resistor with the same level of inherent resistance while providing improved immunity to parasitic capacitance when compared to a single prior-art resistor with the same effective resistance.

Results and Configurations for Stacked Switched Resistance Devices

As described above, the switched stack resistance device 202 provides a larger total resistance than a prior art switched resistor even if the switched stack resistance device 202 and the prior art switched resistor have effectively the same total inherent resistance and parasitic capacitance values and even if the prior-art switched resistor uses multiple smaller resistors connected in series to the switch instead of using a single resistor. This is an unexpected result since one of skill in the art would normally expect a single switch connected in series to the multiple smaller resistances, as depicted in the prior-art switched resistor 102 or the distributed resistance model 140 of FIG. 1, to produce an effective resistance that matches the effective resistance of the stacked switched resistance device embodiments that incorporate a separate switch into each segment of the device. However, as presented above the stacked switched resistance device 202 of FIG. 2 produces the unexpectedly large resistance values that exceed the prior-art switched resistor embodiments and that provide the parasitic immunity and timing requirement advantages over the prior art.

Figure 3:
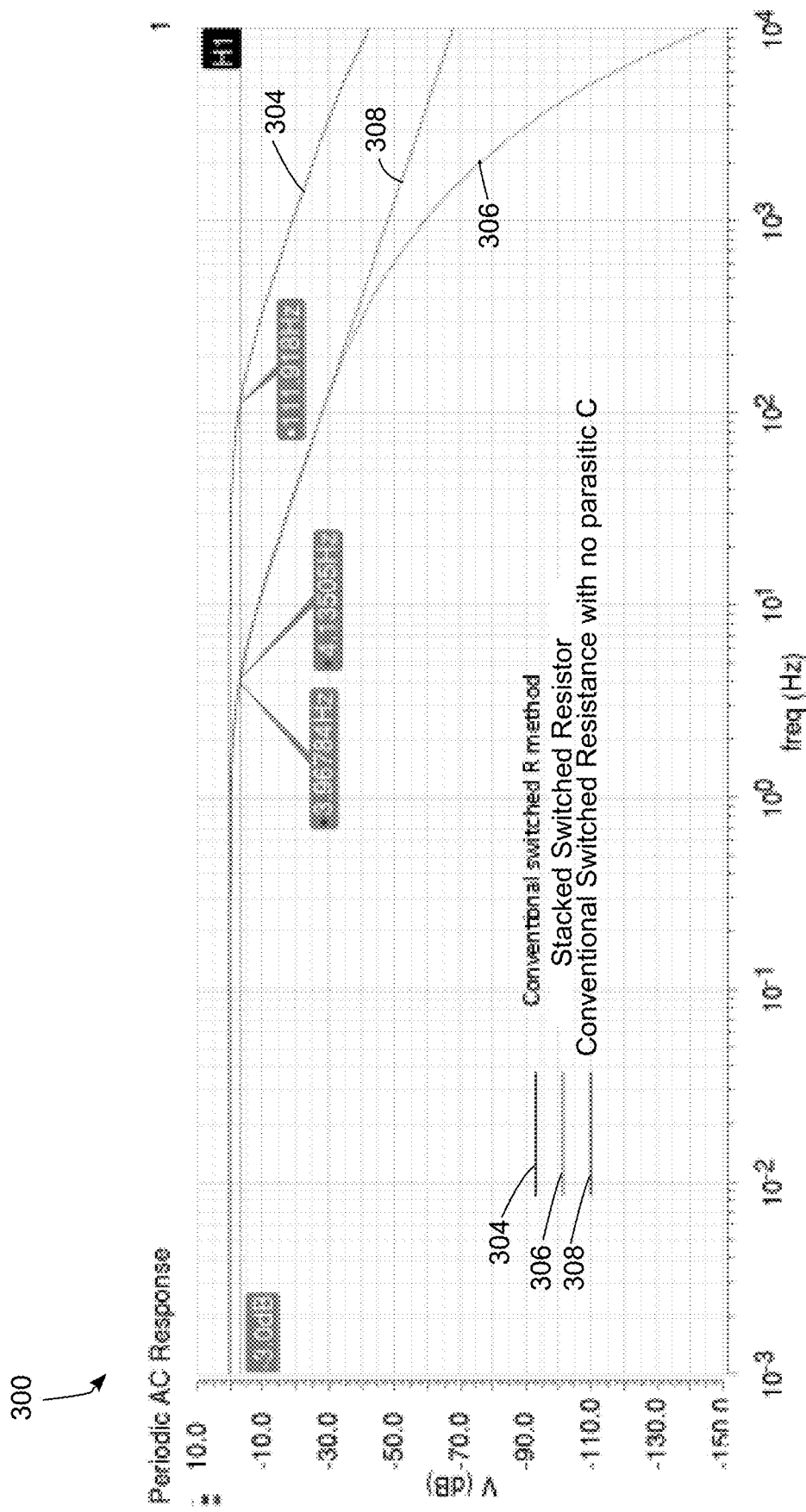
FIG. 3 is a graph depicting the frequency responses of resistor-capacitor (RC) filters that include the stacked switched resistance device of FIG. 2 compared to a prior art switched resistor having the same inherent resistance.

The stacked switched resistance device 202 generates a given effective resistance level with a device that is smaller than prior-art switched resistors, that operates with relaxed timing constraints relative to prior-art switched resistors, or a combination of both. Additionally, the stacked switched resistance device 202 provides additional benefits to high-frequency roll-off when incorporated into RC circuits such as the RC filter circuit 200 of FIG. 2. FIG. 3 depicts a plot 300 of frequency response curves in RC filters that incorporate a practical embodiment of a prior-art switched resistor (curve 304), an embodiment of the stacked switched resistance device 202 (curve 306), and a calculated curve of a switched resistor in which the resistor is unrealistically assumed to have zero parasitic capacitances (curve 308). In FIG. 3 the curve 306 is produced using an embodiment of the stacked switched resistance device 202 with N=10 segments that each include an inherent resistance of 1MΩ (10MΩ total) and an inherent parasitic capacitance of $C_p$=0.5×10$^{-12}$ F (5×10$^{-12}$ F total). Both the prior-art switched resistor that produces the curve 304 and the stacked switched resistance device that produces the curve 306 operate using a single clock signal with a predetermined total clock cycle period ($T_p$) and pulse time ($T_{on}$).

All three curves 304-308 represents the operation of an RC filter using either the prior-art switched resistor including or excluding parasitic capacitance (curves 304 and 308) or the stacked switched resistance device 202 (curve 306) in which the inherent resistance present within each of the devices is equal. FIG. 3 depicts the frequency response curves for a low-pass RC filter that is configured to attenuate components of an input signal that exceed a predetermined cutoff frequency. As depicted in FIG. 3, the curve 306 for the stacked switched resistance device 202 of FIG. 2 includes a much sharper roll-off of the input signal beyond the cutoff frequency for the RC filter compared to either the prior art switched resistor (curve 304) and exceeds the performance of the simulated ideal version of the switched resistor that assumes zero parasitic capacitance (curve 308). Since the RC filter circuit operates as a low-pass filter, the sharper roll-off beyond the cutoff frequency for the stacked switched resistance device 202 that is depicted by the curve 306 is an unexpected beneficial result.

In FIG. 3, all three curves 304-308 are produced using an RC circuit with the same effective resistance and capacitance values, so the improved high frequency roll-off characteristics of the curve 306 are not attributable to a larger resistance value. Instead, it comes from the fact that the structure of the stacked switched resistance device 202 improves the operation of the simple first-order RC filter of FIG. 2 to enable the first-order RC filter to provide high-frequency roll-off characteristics that approximate the performance of higher-order filters without requiring the more complex circuit design that is required for a higher-order filter. As depicted in FIG. 2, each segment of the stacked switched resistance device 202 includes a parasitic capacitance (capacitances 210A-210N). In a practical embodiment of the RC filter circuit 200 each parasitic capacitance is much smaller than the filter capacitor 232, but the parasitic capacitances still affect the operation of the RC filter circuit. The operation of the switches 208A-208N in each of the corresponding segments 204A-204N enable the parasitic capacitances 210A-210N to retain a portion of the charge held in each segment of the stacked switched resistance device 202 while the switches 208A-208N remain opened during operation, which enables the stacked switched resistance device 202 to augment the operation of the standard first-order RC filter to produce a low-pass filter that has unexpectedly improved high-frequency roll-off characteristics compared to an ordinary first-order RC filter.

Figure 4:
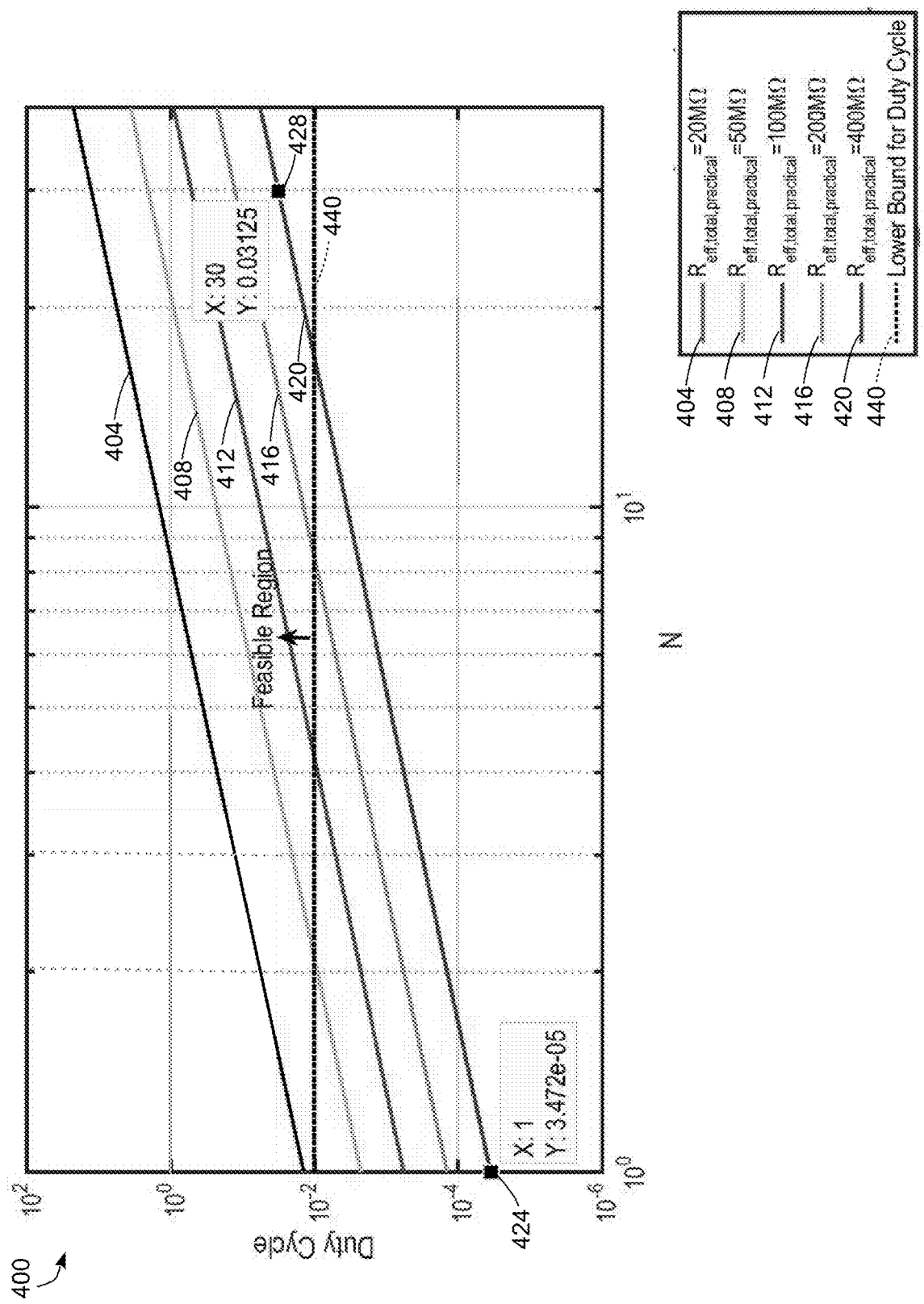
FIG. 4 is a graph depicting combinations of numbers of segments and duty cycle values in a stacked switched resistance device that produce different effective resistance levels.

As described above, different configurations of the stacked switched resistance device 202 produce different effective resistance levels using multiple segments to enable operation with improved immunity to parasitic capacitance and operation using relaxed timing signal constraints to produce a particular effective resistance level. FIG. 4 is a graph 400 that depicts the relationship between the number of segments N in a stacked switched resistance device (x-axis) and the duty cycle D for a clock cycle (y-axis) that produces a given effective resistance for one embodiment of a stacked switched resistance device. The curves 404, 408, 412, 416, and 420 each depict a constant effective resistance level of 20MΩ, 50MΩ, 100MΩ, 200MΩ, and 400MΩ, respectively. Any point along each of the curves represents a combination of duty cycle and segment number parameters that produces the constant effective resistance for the curve. For example, along the curve 420 the point 424 corresponds to a single segment N=1 switched resistor with a duty cycle of $D=3.472 \times 10^{-5}$ that produces the effective 400MΩ resistance. The point 428 represents another configuration that produces the same effective resistance using N=30 segments and a much higher duty cycle parameter D=0.03125. In the graph 400, the threshold line 440 represents a minimum duty cycle for a clock signal with a predetermined time period (e.g. $T_p=2 \times 10^{-5}$ sec corresponding to a 50 KHz clock signal) that can be reproduced with sufficient accuracy in a practical embodiment of the clock source 216 that is depicted in FIG. 2.

As depicted in FIG. 4, to generate a 400MΩ effective total resistance, a stacked switched resistance device with approximately N=20 or more segments enables a relaxed duty cycle of at least 0.01 that enables practical operation of the stacked switched resistance device using the clock source 216. More generally, the stacked switched resistance device of FIG. 2 provides a great deal of flexibility to adjust the total number of segment N and the duty cycle D for operation of the stacked switched resistance device to produce a particular effective resistance level in a manner that is impractical with prior art switched resistors.

While the stacked switched resistance device embodiments described herein are depicted in an RC filter for illustrative purposes, the stacked switched resistors are not limited to use with RC filters and may be employed in any other electrical circuit that would employ a switched resistor. While the embodiments of the stacked switched resistance device described herein are typically implemented with integrated circuits in microelectronics, the stacked switched resistors are not limited to integrated circuits and can be implemented using, for example, discrete resistor and transistor elements.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed is:

1. A stacked switched resistance device comprising:
   a clock source configured to generate a predetermined clock signal at a predetermined frequency and a predetermined duty cycle; and
   a plurality of segments connected in series and configured to produce a first effective resistance, each segment comprising:
      a resistor including an inherent resistance and an inherent parasitic capacitance; and
      a transistor connected in series with the resistor, the transistor having a control terminal operatively connected to clock source and configured to receive the predetermined clock signal, the transistor being configured to operate as a switch to connect and disconnect a current flow through the resistor in response to the predetermined clock signal,
      wherein the first effective resistance of the stacked switched resistance device exceeds a second effective resistance of at least one resistor that is connected in series to a single transistor configured to connect and disconnect the at least one resistor in response to the predetermined clock signal, the at least one resistor having an inherent resistance that is equal to a sum of the inherent resistances of the resistors in the plurality of segments and an inherent parasitic capacitance that is equal to a sum of the inherent parasitic capacitances of the resistors in the plurality of segments.

2. The stacked switched resistance device of claim 1 wherein the clock source is configured to generate the predetermined clock signal to operate each transistor in the plurality of segments simultaneously.

3. The stacked switched resistance device of claim 1 wherein the plurality of segments further comprises two segments.

4. The stacked switched resistance device of claim 1 wherein the plurality of segments further comprises thirty segments.

5. The stacked switched resistance device of claim 1 wherein the resistor in each segment of the plurality of segments has an equal resistance value.

6. The stacked switched resistance device of claim 5 wherein the first effective resistance ($R_{eff,total}$) corresponds to:

$$R_{eff,total} = N \times \frac{R/N}{D + \frac{RC_p}{T_p N^2}}$$

where:
N is a number of the plurality of segments, N≥2;
R is the sum of the inherent resistances of the resistors in the plurality of segments;
$C_p$ is the sum of the inherent parasitic capacitances of the resistors in the plurality of segments;
$T_p$ is a time period of one cycle of the predetermined clock signal; and
D is a duty cycle corresponding to a fraction of $$\frac{T_{on}}{T_p}$$

where $T_{on}$ corresponds to a time of a pulse in each cycle of the predetermined clock signal that closes the transistor in each of the plurality of segments.

7. The stacked switched resistance device of claim 6 wherein an effect of the sum of the inherent parasitic capacitances $C_p$ on the first effective resistance is reduced by a factor of $N^2$ for the number of the plurality of segments.

8. The stacked switched resistance device of claim 1 wherein the plurality of segments are formed in an integrated circuit.

9. A filter circuit comprising:
a stacked switched resistance device comprising:
an input configured to receive a signal to be filtered in the filter circuit;
an output;
a clock source configured to generate a predetermined clock signal at a predetermined frequency and a predetermined duty cycle; and
a plurality of segments connected in series between the input and the output and configured to produce a first effective resistance, each segment comprising:
a resistor including an inherent resistance and an inherent parasitic capacitance; and
a transistor connected in series with the resistor, the transistor having a control terminal operatively connected to clock source and configured to receive the predetermined clock signal, the transistor being configured to operate as a switch to connect and disconnect a current flow through the resistor in response to the predetermined clock signal,
wherein the first effective resistance of the stacked switched resistance device exceeds a second effective resistance of at least one resistor that is connected in series to a single transistor configured to connect and disconnect the at least one resistor in response to the predetermined clock signal, the at least one resistor having an inherent resistance that is equal to a sum of the inherent resistances of the resistors in the plurality of segments and an inherent parasitic capacitance that is equal to a sum of the inherent parasitic capacitances of the resistors in the plurality of segments; and
a filter capacitor connected to the output of the stacked switched resistance device.

10. The filter circuit of claim 9 wherein the clock source is configured to generate the predetermined clock signal to operate each transistor in the plurality of segments simultaneously.

11. The filter circuit of claim 9 wherein the plurality of segments in the stacked switched resistance device further comprises two segments.

12. The filter circuit of claim 9 wherein the plurality of segments in the stacked switched resistance device further comprises thirty segments.

13. The filter circuit of claim 9 wherein the resistor in each segment of the plurality of segments in the stacked switched resistance device has an equal resistance value.

14. The filter circuit of claim 13 wherein the first effective resistance ($R_{eff,total}$) of the stacked switched resistance device corresponds to:

$$R_{eff,total} = N \times \frac{R/N}{D + \frac{RC_p}{T_p N^2}}$$

where:
N is a number of the plurality of segments, N≥2;
R is the sum of the inherent resistances of the resistors in the plurality of segments;
$C_p$ is the sum of the inherent parasitic capacitances of the resistors in the plurality of segments;
$T_p$ is a time period of one cycle of the predetermined clock signal; and
D is a duty cycle corresponding to a fraction of $$\frac{T_{on}}{T_p}$$

where $T_{on}$ corresponds to a time of a pulse in each cycle of the predetermined clock signal that closes the transistor in each of the plurality of segments.

15. The filter circuit of claim 14 wherein an effect of the sum of the inherent parasitic capacitances $C_p$ on the first effective resistance is reduced by a factor of $N^2$ for the number of the plurality of segments.

16. The filter circuit of claim 9 wherein the filter circuit is a low-pass filter.

* * * * *